United States Patent [19]

Schaefer et al.

[11] Patent Number: 5,068,812

[45] Date of Patent: Nov. 26, 1991

[54] EVENT-CONTROLLED LCC STIMULATION

[75] Inventors: Thomas J. Schaefer, Cupertino; Robert D. Shur, Los Altos, both of Calif.

[73] Assignee: VLSI Technology, Inc., San Jose, Calif.

[21] Appl. No.: 381,548

[22] Filed: Jul. 18, 1989

[51] Int. Cl.$^5$ .............................................. G06F 15/18
[52] U.S. Cl. ................................... 364/578; 364/488; 395/500
[58] Field of Search ............... 364/578, 488, 489, 490, 364/200, 900, 513; 371/23

[56] References Cited

U.S. PATENT DOCUMENTS

| | | | |
|---|---|---|---|
| 4,775,950 | 10/1988 | Terada et al. | 364/578 |
| 4,815,024 | 3/1989 | Lewis | 364/578 |
| 4,866,663 | 9/1989 | Griffin | 364/578 |
| 4,924,429 | 5/1990 | Kurashita et al. | 364/578 |
| 4,945,503 | 7/1990 | Takasaki | 364/578 |
| 4,965,743 | 10/1990 | Malin et al. | 364/578 |

FOREIGN PATENT DOCUMENTS 60-163141  8/1985  Japan ................................. 364/578

OTHER PUBLICATIONS

Zeev Barzilai et al.; "HSS-A High Speed Simulator", IEEE Transactions of Computer-Aided Design; July, 1987, pp. 601-617.

Primary Examiner—Parshotam S. Lall
Assistant Examiner—Michael Zanelli
Attorney, Agent, or Firm—Flehr, Hohbach, Test, Albritton & Herbert

[57] ABSTRACT

A method for simulating a levelized logic circuit including an event-controlled feature for marking components to be reevaluated. An evaluation list is formed which lists signals and corresponding components of the logic circuit which are to be reevaluated. A second list is formed of each component and its corresponding output signals. The external input signals are also listed. Each external input signal is tested for change from a previous evaluation and, if so, the corresponding components in the re-evaluation list are marked for reevaluation. Each component, in levelized order, is then tested to determine whether that component is marked for re-evaluation and, if so, that component is re-evaluated and unmarked, and each signal in the component output signal list which has a non-empty re-evaluation list is tested to determine if the value of the signal has changed since the previous evaluation and, if so, all of the components in that signal's reevaluation list are marked for re-evaluation. Evaluation marks are stored as a marking bit in a memory location associated with a component. The components associated with frequently changing input signals are evaluated without setting or testing their evaluation marks. All reevaluation marks are cleared at the beginning of the execution of the simulation.

7 Claims, 2 Drawing Sheets

EVENT-CONTROLLED LCC STIMULATION

BACKGROUND OF THE INVENTION

1. Field of the Invention

This invention relates to logic simulators, and more particularly, to simulators which use levelized compiled code.

2. Prior Art

Simulators for logic circuits are used to predict changes in the signal values of circuit output signals and internal signals as a function of changes in the values of circuit input signals Simulators typically are implemented as a software-controlled computer system. A logic circuit is typically described as an interconnected set, or network, or net, of components, such as AND-gates, inverters, and flip-flops. A circuit description can be produced either as a list of circuit components or as a list of nets, called a net list. When describing a circuit as a list of components, each component entry in the list typically includes the name of a component, its function, and a list of inputs and outputs. When describing a circuit as a net list, each entry in the net list describes one net which connects two or more component pins of various devices, descriptions of which are stored in a library file The signal values of interest for a logic circuit are logic values (typically 0, 1 and a few other values) for the circuit's signals, rather than voltages, etc. Logic circuit simulation is usually done on a general-purpose digital computer, although special-purpose computers, called accelerators, are increasingly being used.

Event-driven simulation is a common method of logic circuit simulation. An "event" is defined as a change in the signal value or logic value of a signal. When an event occurs, that is, when a signal value changes, all components for which that signal is an input signal are scheduled for reevaluation in an event-driven simulation system. These reevaluations may cause additional events which, in turn, cause more reevaluations.

Levelized simulation is a second commonly used method of logic simulation. In this method, the components are levelized, that is, the components of a circuit are arranged or ordered in such a way that one component precedes a second component if the one component produces a signal that is an input signal for a second component. The components can then be evaluated in order. Evaluating components in order results in a faster simulation, because unnecessarily repeated evaluations are avoided. There are cases where no such ordering is possible, for example in the case of a feedback loop where one component produces a signal that is an input signal for another component and the other component produces a signal that is an input signal to the first component. Other more complicated feedback loops are also encountered. In the case of feedback loops, special evaluation techniques are used.

A compiled simulator program for logic circuits, as distinguished from an interpretive simulator program, converts a circuit description directly into a set of machine-language instructions. These machine-language instructions describe the logic functions and interconnection of the components of the circuit. Each component has associated with it a corresponding set of machine language instructions and a corresponding current-value entry in a circuit value table. In contrast, an interpretive, or table-driven, simulator program contains a set of tables in which descriptions of the circuit elements are contained The interpretive simulator operates directly on the set of tables without converting the circuit description to machine language instructions.

Levelized compiled code (LCC) simulation is a form of compiled simulation which incorporates a logic circuit description within the program. First, a circuit is levelized, that is, all of the circuit components are ordered as described above. Then a computer program is generated which evaluates all of the components in order. The program is then compiled. During simulation, the program is executed once for each change in the input signals of a circuit. Because the logic circuit description is incorporated into the compiled program, this method results in faster simulations than can be achieved by programs which treat the circuit description as data elements.

A number of techniques for reducing simulation time have been developed to avoid evaluation of every component each time that a circuit input signal changes. Each circuit component can be tested prior to evaluation to determine whether any of its input signals have changed. Other methods rely on knowledge of particular logic circuits. For example, if a circuit is known to be synchronous and if the clock signals for that circuit are available, it is possible to avoid evaluations during inactive phases of the clock signals. For particular circuits, simulation models uniquely suited for simulation can be individually designed.

Another method of simulating a levelized logic circuit is provided which uses the concept of "fences" to reduce the number of component evaluations required for a simulation. This method is described in a U.S Patent Application Ser. No. 324,283, filed Mar. 15, 1989, by the same inventors as the instant application and assigned to the assignee of the instant application. This method associates certain lists of signals, called "fences," with the components of a logic circuit. During simulation each of these fences is evaluated to determine whether it is an active or an inactive fence, where activity is defined as whether one or more of the signals in a particular fence has changed since the previous evaluation. The components associated with an inactive fence do not need to be evaluated again and the simulator can efficiently move on to process a component which requires evaluation. If a fence is active, the simulator evaluates the components associated therewith. The step of associating a fence with certain logic-circuit components further includes selection of a seed, or starting, set of signals. Initially for each signal of the seed set, a fence is formed consisting of that signal, and the signal is labeled with that fence. Starting from this initial set of fences, additional fences are formed and associated with components and signals, according to a rule which constructs a fence for each component from the fences of the input signals of that component. Seed sets are selected heuristically. Only signals which can cause a component output signal to change are included as part of a fence.

SUMMARY OF THE INVENTION

It is an object of the invention to provide an improved method for simulation of levelized logic circuits.

In accordance with this and other objects of the invention, a method of simulating a levelized logic circuit is provided which is intended to reduce the number of component evaluations required for simulation of a logic circuit.

The method includes generating instructions for event-marking in addition to generating the usual evaluation instruction codes used in levelized compiled-code simulation. The event-marking code instructions mark those components which require evaluation due to changes in the value of their input signals Components which are not marked are skipped during evaluation. Use of the event-marks according to the invention causes each executed evaluation to take more time than if event-marks were not used due to the additional time required for marking components and for checking the marks. However, in circuits with relatively low activity levels, that is, where only a small number of signal values change per circuit evaluation, a large number of evaluations may be skipped, which more than compensates for the additional simulation time used for event-marking.

The method of the invention is a method of simulating a levelized logic circuit. Prior to generation and compiling of the computer instructions for simulating the levelized logic circuit, a list is made of signals and the corresponding components, which are to be reevaluated when a signal changes state. A second list is made of the components and their corresponding output signals. A list of the external input signals to the logic circuit is also made.

For each of the external input signals, computer instructions are provided for testing if the value of that signal has changed from a previous value. If the signal has changed, instructions are provided for marking for reevaluation those components which are in the reevaluation list corresponding to the particular external input signal.

For each component, the method includes testing whether that component is marked for reevaluation and, if so, evaluating that component and, then, clearing the reevaluation marks. For each signal in the component output signal list, the method includes testing if the value of that signal has changed since the previous evaluation and, if so, marking for reevaluation the components in that signal's reevaluation list.

For components which are associated with frequently changing input signals, evaluation is conducted without setting or testing of evaluation marks. For keeping track of the marking status of a component, a marking bit is toggled in a memory location associated with a particular component.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings and tables. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The method of the invention involves steps taken prior to generation of computer instructions, during generation of computer instructions and during simulation. Prior to instruction generation and for each signal in the logic circuit, those components are identified that must be re-evaluated if the value on the signal changes. Those components are almost the same as those on the fanout list of a signal. However, we exclude for example, the data input pins of storage elements since changes on those pins do not by themselves affect the storage elements' outputs or internal states without a clock signal or a control signal change. We call the list of components that must be re-evaluated if a signal changes the "re-evaluation list" of the signal.

Prior to code generation and for each component, identify the signals that are the output signals of that component. We call the list of signals that are outputs of a component the "output signal list" of the component Also identify the external input signals of the circuit.

During code generation of computer instructions, for each external input signal, generate computer instructions to test the value of each signal, and, generate computer instructions that if the signal has changed since the last circuit evaluation, mark for re-evaluation the corresponding components in the re-evaluation list of the signal.

For each component, in levelized order, generate instructions to do the following: Test the reevaluation mark for the component. If the component is not marked for reevaluation, skip the component. Otherwise, evaluate the component, clear its reevaluation mark, and, for each signal in the output signal list of the component, if the signal has a non-empty reevaluation list, test whether the evaluation, and, if so, mark for reevaluation all of the components in that signal's reevaluation list.

During simulation, clear the re-evaluation marks for all components at the beginning of the simulation.

Figure 1:
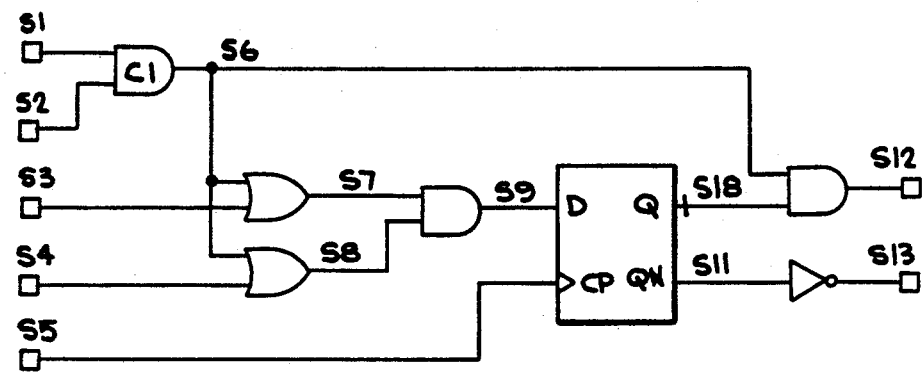
FIG. 1 is a schematic diagram of an exemplary logic circuit to be simulated in accordance with the invention.
Figure 2:
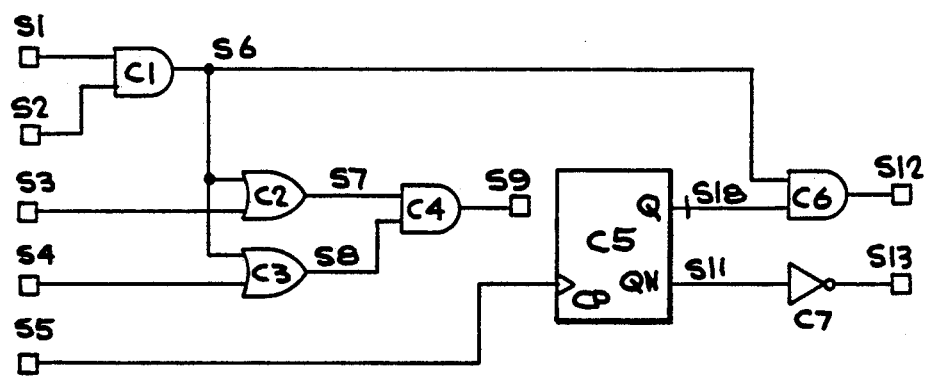
FIG. 2 is a version of the logic circuit of FIG. 1, simplified to eliminate evaluation of certain components.

FIG. 1 is a schematic diagram of an exemplary circuit, which will be used to demonstrate the method of the invention. Recall that the data (D) inputs of storage elements are excluded from the event-marking code generation. Therefore, the circuit arrangement shown in FIG. 2 is used.

Prior to generation of computer instructions, the values in the three tables shown below are computed. The tables are filled in for the exemplary circuit of FIG. 2. For example, the signal S6 is an input to components C2, C3, and C6. These three components comprise the reevaluation list for S6. The component C5 has two output signals, S10 and S11. These signals are listed in the component/output signals table.

TABLE #1

| Reevaluation List | |
|---|---|
| Signal | Component |
| S1 | C1 |
| S2 | C1 |
| S3 | C2 |
| S4 | C3 |
| S5 | C5 |
| S6 | C2,C3,C6 |
| S7 | C4 |
| S8 | C4 |
| S9 | |
| S10 | C6 |
| S11 | C7 |
| S12 | |
| S13 | |

TABLE #2

| Output Signal List | |
|---|---|
| Component | Output Signals |
| C1 | S6 |
| C2 | S7 |
| C3 | S8 |
| C4 | S9 |
| C5 | S10, S11 |
| C6 | S12 |
| C7 | S13 |

TABLE #3

| External Input Signals |
|---|
| S1 |
| S2 |
| S3 |
| S4 |
| S5 |

The following functions are used:

isMarked(c), which has the value TRUE if component C is marked for reevaluation, and has the value FALSE otherwise.

mark(c), which sets the re-evaluation mark for component C.

unmark(c), which clears the re-evaluation mark for component C.

hasChanged (s), which has the value TRUE if signal S has changed values since the previous circuit evaluation, and has the value FALSE otherwise.

Each of the external input signals is processed by testing whether or not the value of the signal has changed If so, the compqnents in the signal's re-evaluation list are marked. For example, for signal S1 we provide the following instruction:

if hasChanged (s1) then mark (C1).

The components are then processed in levelized order. For each component, if the component is marked for re-evaluation, the system evaluates it, clears the re-evaluation mark, and tests the output signals for changes. For each changed output signal, the components in the re-evaluation list of that signal are marked. For component C1, for example, the following instruction is generated:

if isMarked(C1) then
begin
eval(C1);
unmark(C1);
if hasChanged (S6) then begin mark (C2); mark(C3); mark(C6); end;
end;

Other components are processed similarly. A complete simulation model set of instructions is shown below:

```
begin
if hasChanged(S1) then mark(C1)
if hasChanged(S2) then mark(C1)
if hasChanged(S3) then mark(C2)
if hasChanged(S4) then mark(C3)
if hasChanged(S5) then mark(C5)
if isMarked(C1) then
  begin
  eval(C1);
  unmark(C1);
  if hasChanged(S6) then begin mark(C2); mark(C3); mark(C6); end;
  end;
if isMarked(C2) then
  begin
  eval(C2);
  unmark(C2);
  if hasChanged(S7) then mark(C4);
  end;
if isMarked(C3) then
  begin
  eval(C3);
  unmark(C3);
  if hasChanged(S8) then mark(C4);
  end;
if isMarked(C4) then
  begin
  eval(C4);
  unmark(C4);
  end;
if isMarked(C5) then
  begin
  eval(C5);
  unmark(C5);
  if hasChanged(S10) then mark(C6);
  if hasChanged(S11) then mark(C7);
  end;
if isMarked(C6) then
  begin
  eval(C6);
  unmark(C6);
  end;
if isMarked(C7) then
  begin
  eval(C7);
  unmark(C7);
  end;
end;
```

Note that component C5 has two outputs, S10 and S11. The code generated for C5 tests both of these outputs for changes. SIgnals S9 and S12 and S13 have empty re-evaluation lists. There is therefore no point in testing these signals for changes. Components C4, C6, and C7 do not test their outputs.

Figure 3:
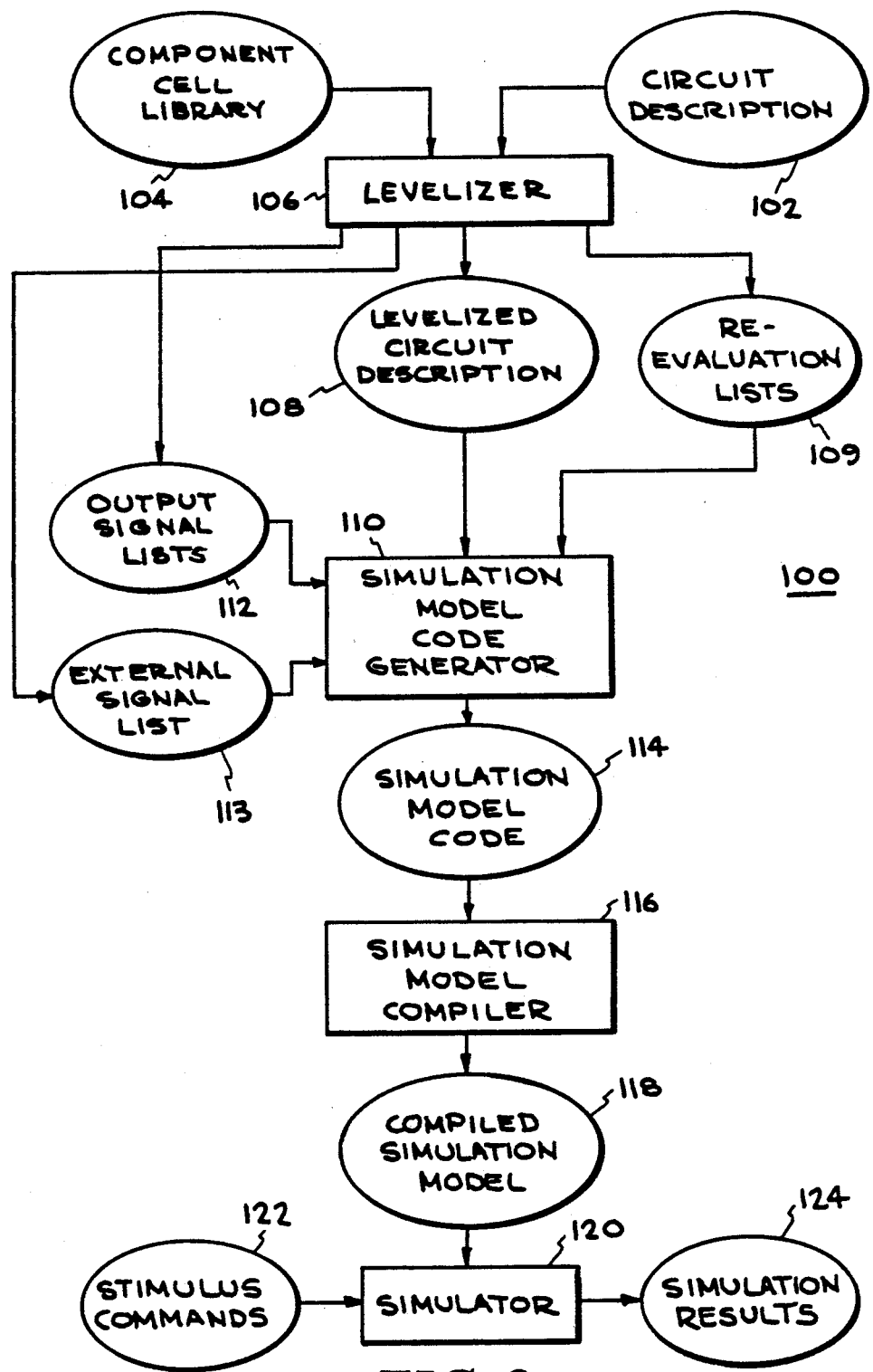
FIG. 3 is process a block diagram for performing a levelized compiled code (LCC) simulation using event-marks according to the invention.

FIG. 3 shows a process block diagram 100 showing various data sets, functions, and instructions for performing simulation of a logic circuit according to the invention. The components and their interconnections are represented in the circuit description 102 while the characteristics of the components are contained in a component cell library table 104. A levelizer 106 orders the components such that a first component precedes a second component if the first component produces a signal that is an input signal to the second component. The levelizer 106 produces a levelized circuit description 108, re-evaluation lists 109 for each component output signal lists 112 for each component, and an external input signal list 113, all of which are fed into a simulation code generator 110 which generates a simulation model code 114. This code 114 is a list of evaluation instructions to be performed for each component. The code 114 also includes instructions generated by the code generator 110 for re-evaluating components and for clearing re-evaluation marks. Code is also provided for testing whether a signal has changed and, if so, for marking a component for re-evaluation. This code 114 is then compiled in a compiler 116 to produce a levelized compiled code LCC model 118 for the logic circuit being evaluated. The LCC is then processed in a simulator 120 with appropriate stimulus commands 122 being supplied to produce simulation results 124.

Alternatively, instead of clearing a component's event mark at the time that the component is evaluated (as indicated by the unmark instruction), all of the re-evaluation marks are cleared at the end of the circuit evaluation, or at the start of the next evaluation. The relative efficiency of this method depends on the activity level of the circuit and on the particular computer system programmed to run the simulation. Some computer systems have very efficient block storage clear functions that may more than make up for the advantage of clearing only those individual marks that have been set.

If some signal is known to change very frequently, it is often advantageous to simply evaluate the components in that signal's re-evaluation list without checking their re-evaluation marks, and to avoid setting those marks every time the signal changes. Components that are to be always evaluated are removed from the re-evaluation lists of all signals, since there is no point in having any signal value change cause these components to be marked.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A method of simulating operation of a levelized logic circuit, said method comprising the steps of:
   storing in a computer memory data representing a specified logic circuit, said logic circuit having a number of nodes between which are connected circuit components, each of said nodes having a signal present thereat with the value of said signal indicating the state of said node; said stored logic circuit data including an assigned logic level for each circuit component;
   computing a storing in said computer memory a set of evaluation lists, each said evaluation list corresponding to a signal and denoting those components that are to be evaluated when said signal changes value;
   computing and storing in said computer memory an output signal list denoting output signals corresponding to each component of said logic circuit;
   computing and storing in said computer memory a list of external input signals to the logic circuit;
   whenever an external input signal changes value, storing an evaluation mark for each component in said external input signal's evaluation list; and
   for each component, in levelized order, for which an evaluation mark has been stored;
   evaluating the component;
   clearing the evaluation mark for the component; and
   for each signal in the output signal list corresponding to said evaluated component which has a nonempty evaluation list, (A) determining whether the value of the signal was changed by said evaluating step; and (B) if the value of the signal has changed, storing evaluation marks for all of the components in that signal's evaluation list.

2. The method of claim 1 including the step of clearing all of the evaluation marks for all of the components at the beginning of each circuit evaluation.

3. THe method of claim 1 including the step of clearing all of the evaluation marks for all of the components at the end of each circuit simulation.

4. The method of claim 1 including the step of evaluating components associated with input signals that change frequently without determining whether the value of said input signals have changed.

5. A method of automatically generating program instructions for a compiled computer program, which is used for simulating a levelized logic circuit, said method of automatically generating program instructions comprising the steps of:
   (5-1) generating program instructions for:
   (A) storing in a computer memory data representing a specified logic circuit, said logic circuit having a number of nodes between which are connected circuit components, each of said nodes having a signal present thereat with the value of said signal indicating the state of said node; said stored logic circuit data including an assigned logic level for each circuit component;
   (B) computing and storing in said computer memory a set of evaluation lists, each said evaluation list corresponding to a signal and denoting those components that are to be evaluated when said signal changed value;
   (C) computing and storing in said computer memory an output signal is denoting output signals corresponding to each component of said logic circuit;
   (D) computing and storing in said computer memory a list of external input signals to the logic circuit;
   (E) whenever an external input signal changes value, storing an evaluation mark for each component in said external input signal's evaluation list; and
   (F) for each component, in levelized order, for which an evaluation mark has been stored:
   evaluating the component;
   clearing the evaluation mark for the component; and
   for each signal in the output signal list corresponding to said evaluated component which has a non-empty evaluation list, (A) determining whether the value of the signal was changed by said evaluating step; and (B) if the value of the signal has changed, storing evaluation marks for all of the components in that signal's evaluation list; and (5-2) compiling said generated program instructions into a compiled computer program for simulating said specified logic circuit.

6. The method of claim 5, including the step of generating program instructions for clearing all said evaluation marks at the beginning of each circuit evaluation.

7. The method of claim 5, including the step of generating program instructions for automatically evaluating components associated with input signals that change frequently without determining whether the value of said input signals have changed.

* * * * *